(12) United States Patent
Seo et al.

(10) Patent No.: US 12,178,113 B2
(45) Date of Patent: Dec. 24, 2024

(54) MASK, METHOD OF MANUFACTURING THE SAME, AND METHOD OF MANUFACTURING DISPLAY PANEL

(71) Applicant: Samsung Display Co., Ltd., Yongin-si (KR)

(72) Inventors: Kabjong Seo, Hwaseong-si (KR); Minsuk Ko, Cheonan-si (KR); Bogeon Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 476 days.

(21) Appl. No.: 17/463,505

(22) Filed: Aug. 31, 2021

(65) Prior Publication Data
US 2022/0165951 A1    May 26, 2022

(30) Foreign Application Priority Data
Nov. 26, 2020    (KR) .................. 10-2020-0161302

(51) Int. Cl.
| | |
|---|---|
| *H10K 71/16* | (2023.01) |
| *C23C 14/04* | (2006.01) |
| *C23C 16/04* | (2006.01) |
| *G03F 7/00* | (2006.01) |
| *H10K 59/12* | (2023.01) |
| *H10K 71/00* | (2023.01) |

(52) U.S. Cl.
CPC ......... *H10K 71/166* (2023.02); *C23C 14/042* (2013.01); *C23C 16/042* (2013.01); *G03F 7/0015* (2013.01); *H10K 59/12* (2023.02); *H10K 71/00* (2023.02); *H10K 71/164* (2023.02)

(58) Field of Classification Search
CPC ..... H10K 71/166; H10K 71/00; H10K 71/164
See application file for complete search history.

(56) References Cited

U.S. PATENT DOCUMENTS

| | | | | |
|---|---|---|---|---|
| 2016/0162076 | A1* | 6/2016 | Fukagawa | .......... C08G 18/8009 525/289 |
| 2017/0110366 | A1* | 4/2017 | Lu | ....................... H01L 21/0332 |

FOREIGN PATENT DOCUMENTS

| | | |
|---|---|---|
| JP | 2011013382 A | 1/2011 |
| JP | 2019044253 | 3/2019 |
| KR | 1020170130014 | 11/2017 |

* cited by examiner

*Primary Examiner* — Binh X Tran
(74) *Attorney, Agent, or Firm* — CANTOR COLBURN LLP

(57) ABSTRACT

A manufacturing method of a mask includes forming a first mask layer, forming a second mask layer on the first mask layer, forming a photoresist pattern layer on the second mask layer, removing a first area of the second mask layer, which is exposed through the photoresist pattern layer, defining an opening through the first mask layer, removing a portion of the photoresist pattern layer to expose a portion of a second area of the second mask layer, and removing the portion of the second area of the second mask layer.

16 Claims, 14 Drawing Sheets

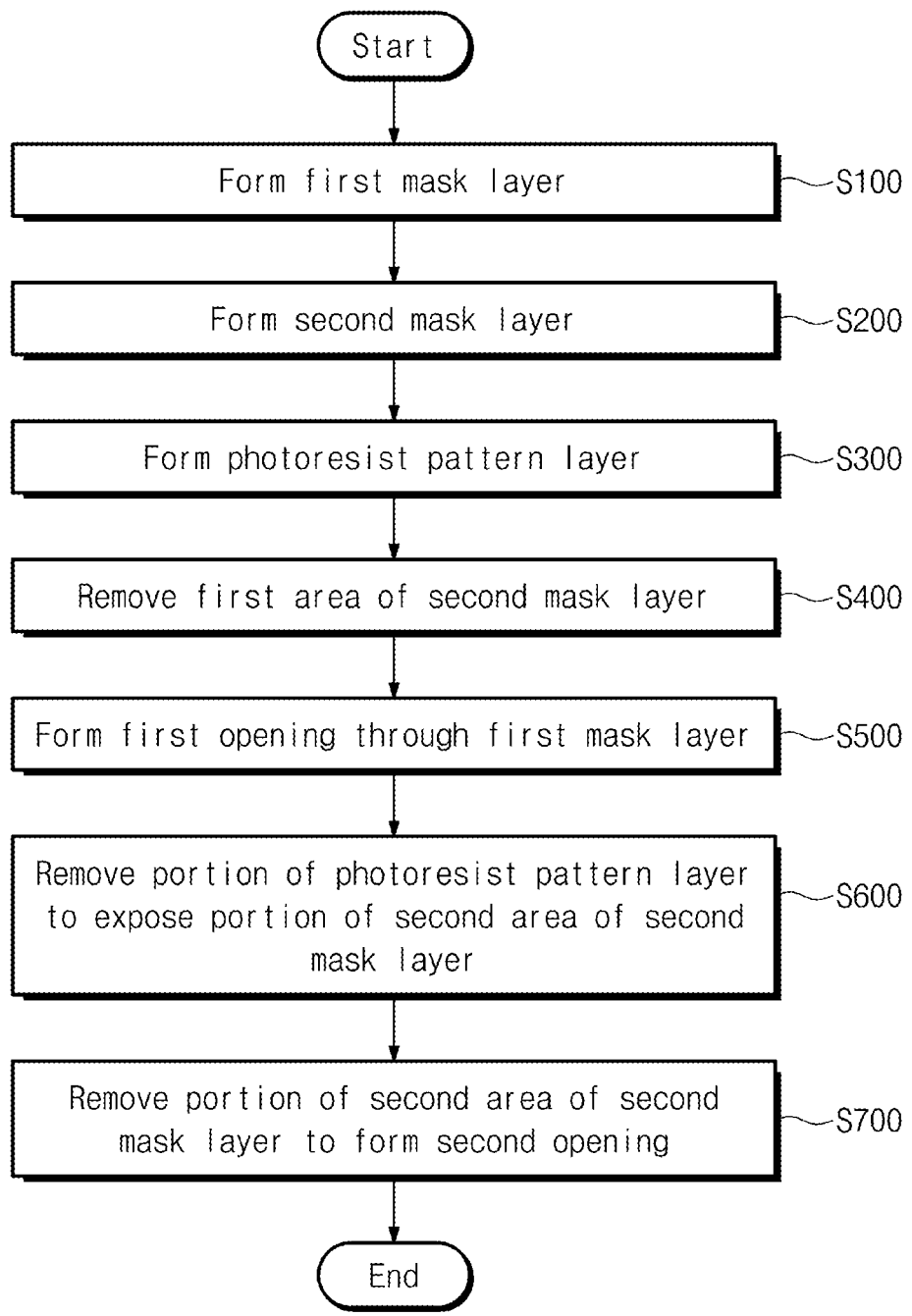

MASK, METHOD OF MANUFACTURING THE SAME, AND METHOD OF MANUFACTURING DISPLAY PANEL

This application claims priority to Korean Patent Application No. 10-2020-0161302, filed on Nov. 26, 2020, and all the benefits accruing therefrom under 35 U.S.C. § 119, the content of which in its entirety is herein incorporated by reference.

BACKGROUND

1. Field

Embodiments of the invention relate to a mask having improved reliability, a method of manufacturing the mask, and a method of manufacturing a display panel.

2. Description of the Related Art

A display panel includes a plurality of pixels. Each of the pixels includes a light emission pattern disposed between electrodes facing each other. The light emission pattern is formed by various, methods including a deposition method using a mask is used. The light emission pattern is patterned using the mask through which holes are defined, and thus, the light emission pattern is formed in predetermined areas exposed through the holes. The light emission pattern has a shape determined by a shape of the holes.

SUMMARY

Embodiments of the invention provide a mask capable of being manufactured by a simplified process and having improved reliability in a deposition process.

Embodiments of the invention provide a method of manufacturing the mask.

Embodiments of the invention provide a method of manufacturing a display panel using the mask.

An embodiment of the invention provides a method of manufacturing a mask. The method includes forming a first mask layer, forming a second mask layer on the first mask layer, forming a photoresist pattern layer on the second mask layer, removing a first area of the second mask layer, which is exposed through the photoresist pattern layer, defining an opening through the first mask layer, removing a portion of the photoresist pattern layer and exposing a portion of a second area of the second mask layer, and removing the portion of the second area of the second mask layer.

In an embodiment, the forming the photoresist pattern layer includes forming a photoresist layer on the second mask layer, disposing an exposure mask including a first mask area having a first transmittance, a second mask area having a second transmittance smaller than the first transmittance, and a third mask area having a third transmittance smaller than the second transmittance, which are defined therein, on the photoresist layer, and patterning the photoresist layer using the exposure mask.

In an embodiment, a photo opening and a groove surrounding the photo opening may be defined in the photoresist pattern layer, and the photo opening overlaps the first area of the second mask layer.

In an embodiment, the photo opening is defined in a first portion of the photoresist layer overlapping the first mask area, and the groove is defined in a second portion of the photoresist layer overlapping the second mask area.

In an embodiment, the photo opening is defined through the photoresist pattern layer from a first surface of the photoresist pattern layer to a second surface of the photoresist pattern layer opposite to the first surface of the photoresist pattern layer, and the groove has a depth that is smaller than a maximum thickness of the photoresist pattern layer.

In an embodiment, the second area of the second mask layer overlaps the groove.

In an embodiment, the second mask area is spaced apart from the first mask area with the third mask area interposed therebetween.

In an embodiment, the second area of the second mask layer overlaps a sidewall of the first mask layer, which defines the opening.

In an embodiment, the portion of the photoresist pattern layer is removed when the opening is defined through the first mask layer.

In an embodiment, the first mask layer has a thickness greater than a thickness of the second mask layer.

In an embodiment, the first mask layer includes a polymer material, and the second mask layer includes a conductive material.

In an embodiment, the second area of the second mask layer surrounds the first area of the second mask layer.

In an embodiment, a maximum area size of the opening is greater than an area size of the first area of the second mask layer in a plan view.

An embodiment of the invention provides a method of manufacturing a display panel. The method incudes forming a mask through which a through-hole is defined, preparing a target substrate, disposing the mask on the target substrate, forming a light emitting pattern in a light emitting area of the target substrate corresponding to the through-hole, and removing the mask. The forming the mask includes forming a first mask layer, forming a second mask layer on the first mask layer, forming a photoresist pattern layer in which a photo opening and a groove surrounding the photo opening are defined on the second mask layer, removing a first area of the second mask layer, which overlaps the photo opening, etching a portion of the first mask layer and a portion of the photoresist pattern layer, and etching a second area of the second mask layer exposed through the etched groove.

In an embodiment, the portion of the first mask layer is removed and an opening is defined through the first mask layer from a first surface of the first mask layer to a second surface of the first mask layer opposite to the first surface of the first mask layer.

In an embodiment, the etching the second area of the second mask layer includes removing a portion of the second mask layer, which overlaps the opening.

In an embodiment, the forming the photoresist pattern layer includes forming a photoresist layer on the second mask layer, disposing an exposure mask including a first mask area having a first transmittance, a second mask area having a second transmittance smaller than the first transmittance, and a third mask area having a third transmittance smaller than the second transmittance, on the photoresist layer, and patterning the photoresist layer using the exposure mask. The photo opening is defined in a portion of the photoresist layer, which overlaps the first mask area of the exposure mask, and the groove is defined in another portion of the photoresist layer, which overlaps the second mask area of the exposure mask.

An embodiment of the invention provides a mask including a first mask layer through which a first opening is defined and which includes a polymer material, and a second mask layer which contacts a surface of the first mask layer and through which a second opening is defined. A first sidewall of the first mask layer defining the first opening is aligned with a second sidewall of the second mask layer defining the second opening.

In an embodiment, the first sidewall of the first mask layer and the second sidewall of the second mask layer are consecutively connected to each other and define a sidewall.

In an embodiment, the first sidewall of the first mask layer and the second sidewall of the second mask layer are spaced apart from each other in a plan view, and a distance between the first sidewall and the second sidewall is constant.

According to the above, the first opening of the first mask layer is defined while the protruded tip portion of the second mask layer is removed using the photoresist pattern layer that is provided through one photolithography process. Thus, the product quality of the mask is improved and the cost of manufacturing the mask is reduced.

BRIEF DESCRIPTION OF THE DRAWINGS

The above and other embodiments, features and advantages of the invention will become readily apparent by reference to the following detailed description when considered in conjunction with the accompanying drawings in which:

FIG. 3 is a flowchart showing a method of manufacturing an embodiment of a mask according to the invention;

DETAILED DESCRIPTION

Figure 1:
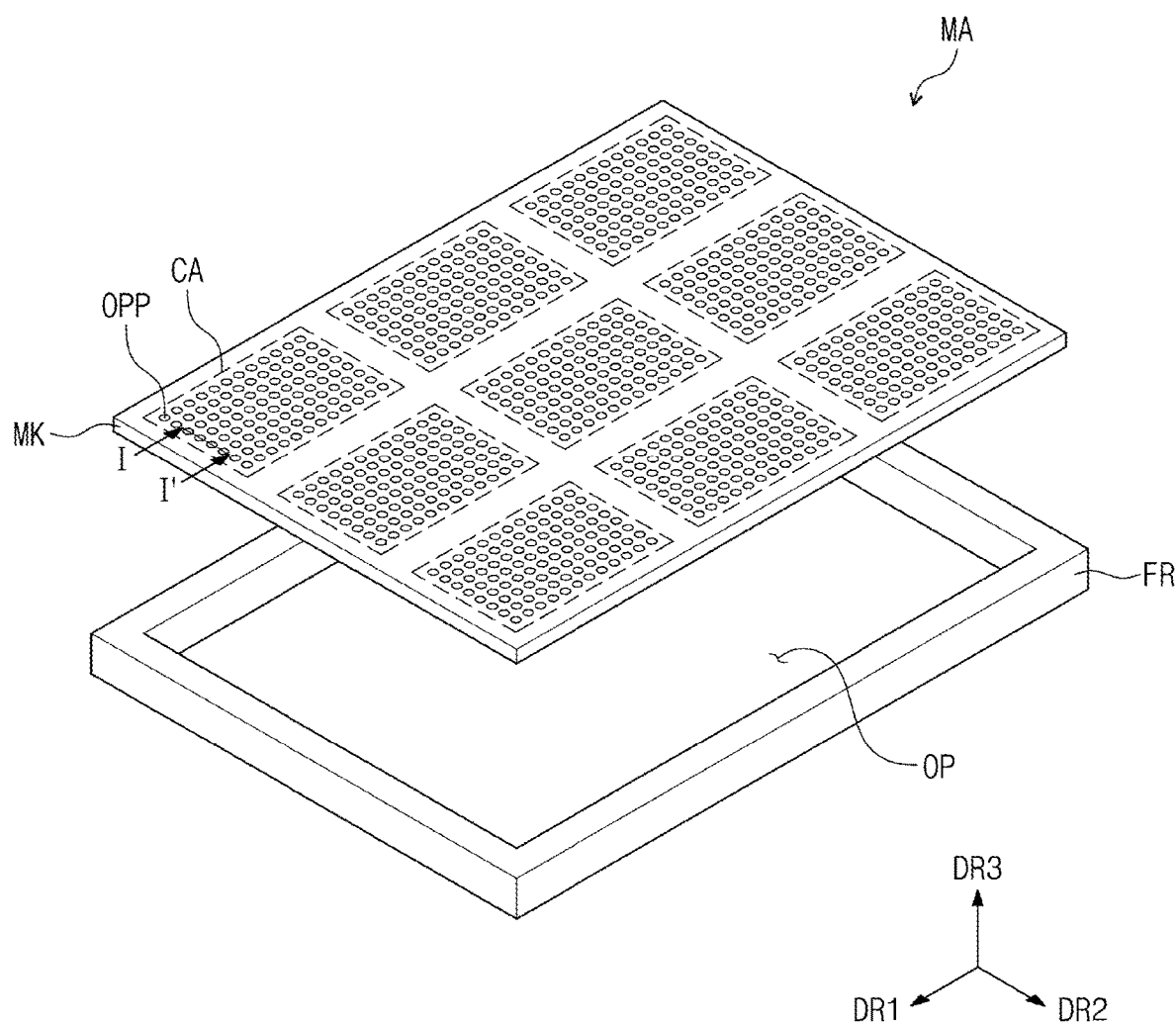
FIG. 1 is an exploded perspective view showing an embodiment of a mask assembly according to the invention.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the drawing figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments of the invention will be described with reference to accompanying drawings.

FIG. 1 is an exploded perspective view showing an embodiment of a mask assembly MA according to the invention.

Referring to FIG. 1, the mask assembly MA may be used for a process to deposit a deposition material. In an embodiment, the mask assembly MA may include a frame FR and a mask MK.

An upper surface of each element may be substantially parallel to a plane defined by a first direction DR1 and a second direction DR2. A third direction DR3 indicates a thickness direction of each element. An upper side (or upper portion) and a lower side (or lower portion) of each element are distinguished by the third direction DR3. However, directions indicated by the first, second, and third directions DR1, DR2, and DR3 may be relative to each other and may be changed to other directions.

The frame FR may have a ring shape in a plan view. That is, an opening OP may be defined in an area including a center of the frame FR. The opening OP may be a hole penetrating from an upper surface of the frame FR to a lower surface of the frame FR. The expression "in a plan view" may mean a state of being viewed in the third direction DR3. FIG. 1 shows a quadrangular ring shape as a representative shape of the frame FR, however, the shape of the frame FR should not be limited thereto or thereby. In an embodiment, the frame FR may have other shapes, e.g., a circular ring shape, a polygonal ring shape, etc., for example.

FIG. 1 shows a structure in which the frame FR is disposed under the mask MK and supports the mask MK, however, the frame FR and the mask MK should not be limited thereto or thereby. In an embodiment, the frame FR may be disposed on and under an edge of the mask MK, may support the mask MK, and may extend the mask MK in the first direction DR1 and the second direction DR2.

The mask MK may include a plurality of cell areas CA arranged in the first direction DR1 and the second direction DR2. In the illustrated embodiment, the cell areas CA are arranged along the first direction DR1 and the second direction DR2 in a matrix of three rows by three columns, however, this is merely one example. In an embodiment, the mask MK may include a greater number of the cell areas CA than those shown in FIG. 1, for example. As another way, the cell areas CA may be arranged in only one of the first direction DR1 and the second direction DR2. As another way, the mask MK may include only one cell area CA defined therein, and the invention should not be particularly limited.

The mask MK in the embodiment may have a plate shape extending in the first direction DR1 and the second direction DR2. The mask MK may have a single unitary plate shape to connect the cell areas CA to each other. The mask MK may include a first mask layer MK1 (refer to FIG. 2) including a polymer material such as polyimide ("PI"). Accordingly, the mask MK may have the plate shape extending in each of the first direction DR1 and the second direction DR2 rather than having a stick shape extending in only one direction of the first direction DR1 and the second direction DR2, however, it should not be limited thereto or thereby. In an embodiment of the invention, the mask MK may have the stick shape extending in one direction of the first direction DR1 and the second direction DR2. In this case, the mask assembly MA may include a plurality of masks, and the masks may be spaced apart from each other in the other direction of the first direction DR1 and the second direction DR2.

A plurality of through-holes OPP may be defined through each of the cell areas CA. The through-holes OPP may be arranged in the first direction DR1 and the second direction DR2 to be spaced apart from each other. Each of the through-holes OPP may penetrate through the mask MK in the thickness direction DR3 of the mask MK.

Figure 2:
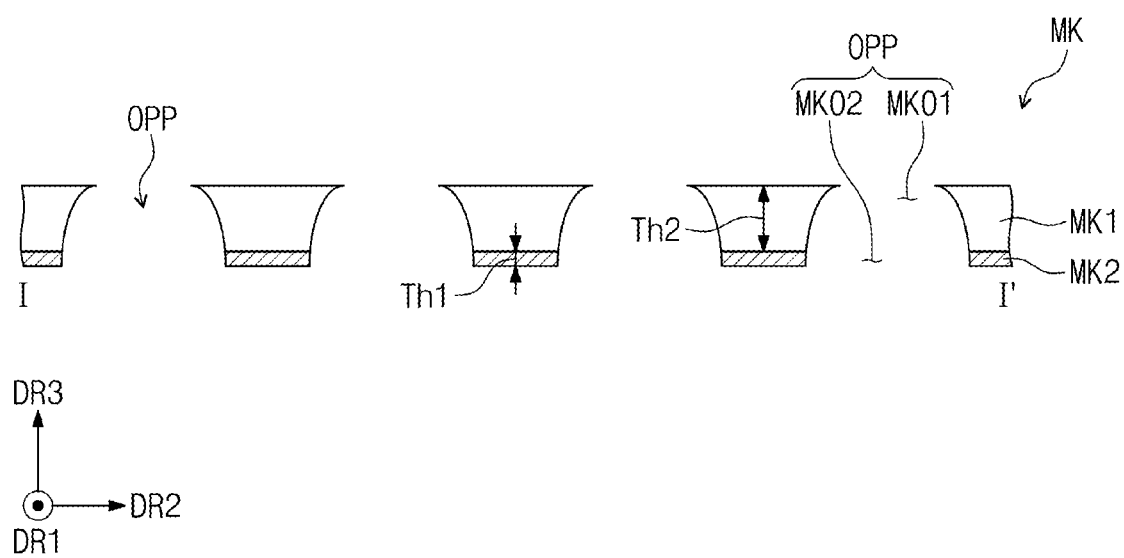
FIG. 2 is a cross-sectional view showing an embodiment of a mask according to the invention.

FIG. 2 is a cross-sectional view showing an embodiment of the mask MK according to the invention. FIG. 2 shows a cross-section taken along line I-I' shown in FIG. 1.

Referring to FIGS. 1 and 2, the mask MK may include the first mask layer MK1 and a second mask layer MK2. The second mask layer MK2 may be disposed on one surface of the first mask layer MK1.

The mask MK may be provided with at least one through-hole OPP defined therethrough. In an embodiment, the mask MK may be provided with the through-holes OPP defined therethrough, for example. The through-holes OPP may be arranged in the first direction DR1 and/or the second direction DR2 and may be spaced apart from each other at regular intervals to form a predetermined pattern. Each of the through-holes OPP may penetrate through the mask MK in the third direction DR3.

The first mask layer MK1 may be provided with a first opening MKO1 defined therethrough, and the second mask layer MK2 may be provided with a second opening MKO2 defined therethrough. The through-hole OPP may be defined by the first opening MKO1 and the second opening MKO2.

The first mask layer MK1 may include a polymer material. In an embodiment, the first mask layer MK1 may include the polymer material, such as PI, polycarbonate ("PC"), polyethylene naphthalene ("PEN"), or polyethylene terephthalate ("PET"), for example, however, it should not be particularly limited.

The second mask layer MK2 may include a material that may be fixed to an electrostatic chuck. Being fixed to the electrostatic chuck may mean that an attractive force is generated between the electrostatic chuck and the second mask layer MK2. The second mask layer MK2 may include a metal, metal alloy, or transparent conductive oxide. In an embodiment, the second mask layer MK2 may include at least one of a conductive metal, such as nickel (Ni), gold (Au), titanium (Ti), titanium nitride (TiNx), molybdenum (Mo), or the like, and a conductive metal oxide, such as indium tin oxide ("ITO"), indium zinc oxide ("IZO"), or the like, for example.

The first mask layer MK1 may have a thickness Th1 determined by taking into account a durability of the mask MK and a deposition precision. In an embodiment, the thickness Th1 of the first mask layer MK1 may be within a range from about 5 micrometers (μm) to about 15 μm, for example, however, it should not be particularly limited. The second mask layer MK2 may have a thickness Th2 smaller than the thickness of the first mask layer MK1. In an embodiment, the thickness Th2 of the second mask layer MK2 may be within a range from about 500 angstroms (Å) to about 1500 Å, for example, however, it should not be limited thereto or thereby.

In an embodiment, the mask MK may include the first mask layer MK1 including a polymer resin. In this case, compared with a case of forming a mask with an alloy such as Invar, the mask with a smaller thickness may be provided, and cost and time may be reduced in a process of forming the through-hole OPP. In addition, since the mask MK includes the second mask layer MK2 including the conductive material, the mask MK and a target substrate may be in close contact with each other, a shadow occurring in the deposition process may be reduced, and thus, a more precise deposition process may be implemented.

Hereinafter, a method of manufacturing the mask in an embodiment of the invention will be described. In describing the manufacturing method of the mask in an embodiment, the above-described components will be assigned with the same reference numerals, and thus, details thereof will be omitted.

FIG. 3 is a flowchart showing an embodiment of the manufacturing method of the mask according to the invention. FIGS. 4A to 4G are cross-sectional views showing an embodiment of the manufacturing method of the mask according to the invention.

Figure 4A:
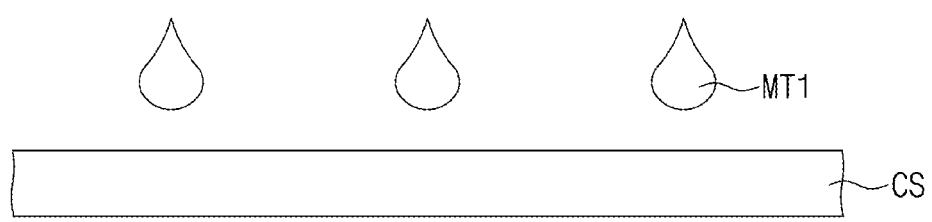
FIGS. 4A to 4G are cross-sectional views showing an embodiment of a method of manufacturing a mask according to the invention.
Figure 4B:
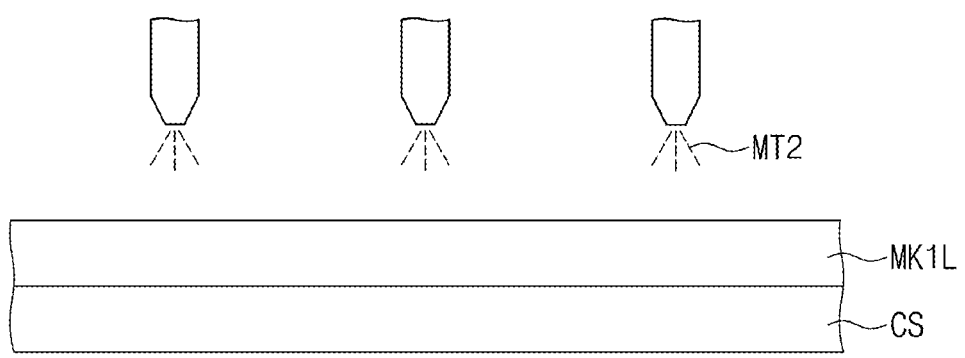

Referring to FIGS. 3, 4A, and 4B, a polymer resin MT1 may be coated on a carrier substrate CS to form a first mask layer MK1L (S100).

Figure 4C:
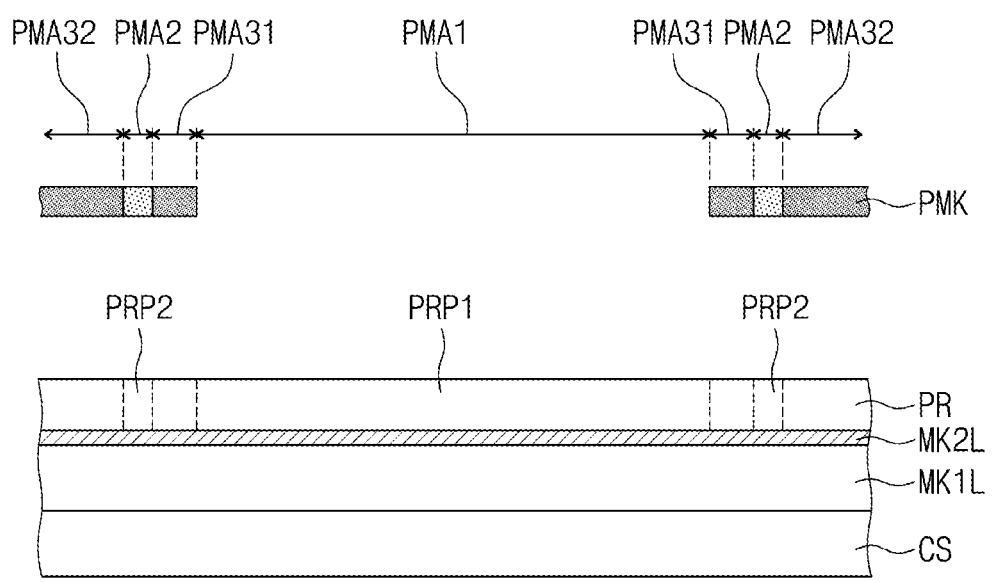

Referring to FIGS. 3, 4B, and 4C, a conductive material MT2 may be provided on one surface of the first mask layer MK1L to form a second mask layer MK2L (S200). The conductive material MT2 may be provided on the one surface of the first mask layer MK1L by a physical deposition, chemical deposition, or coating process. In an embodiment, the physical deposition process may be a sputtering process, and the chemical deposition process may be a chemical vapor deposition method ("CVD") or a plasma chemical vapor deposition method ("PECVD"), for example.

Then, a photoresist layer PR may be disposed on the second mask layer MK2L. An exposure mask PMK may be disposed above the photoresist layer PR to pattern the photoresist layer PR. An exposure process may be carried out while the exposure mask PMK is disposed above the photoresist layer PR.

The exposure mask PMK may be provided with a first mask area PMA1, a second mask area PMA2, and third mask areas PMA31 and PMA32 defined therein. The first mask area PMA1, the second mask area PMA2, and the third mask areas PMA31 and PMA32 may have different transmittances from each other.

The first mask area PMA1 may have a first transmittance, the second mask area PMA2 may have a second transmittance, and the third mask areas PMA31 and PMA32 may have a third transmittance. The second transmittance may be smaller than the first transmittance, and the third transmittance may be smaller than the second transmittance. In an embodiment, the first transmittance may be about 100 percent, and the third transmittance may be zero (0) percent, for example. The second transmittance may be greater than zero (0) percent and smaller than 100 percent. Accordingly, the first mask area PMA1 may be a transmissive area, the second mask area PMA2 may be a semi-transmissive area or a halftone area, and the third mask areas PMA31 and PMA32 may be a light blocking area.

Figure 4D:
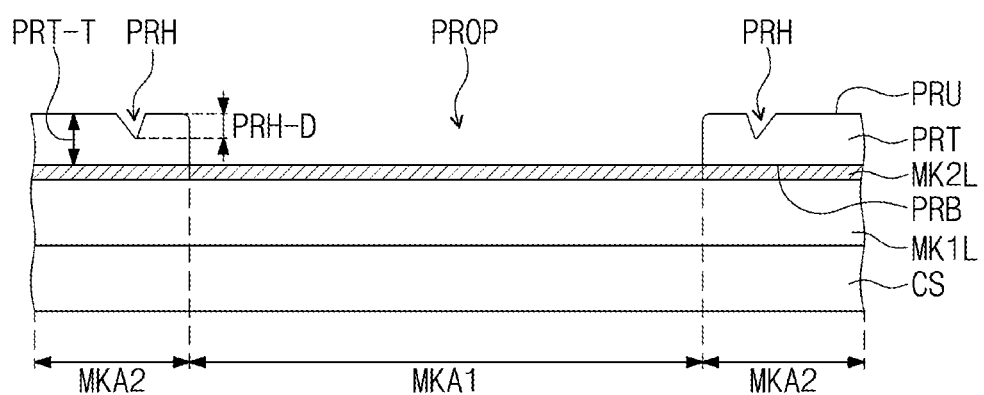

Referring to FIGS. 3, 4C, and 4D, the photoresist layer PR having chemical properties changed by receiving a light may be removed through a development process to form a photoresist pattern layer PRT (S300).

A photo opening PROP and a groove PRH surrounding the photo opening PROP may be defined in the photoresist pattern layer PRT. The photo opening PROP may be provided by removing a first portion PRP1 of the photoresist layer PR overlapping the first mask area PMA1, and the groove PRH may be provided by removing a portion in the thickness direction DR3 of a second portion PRP2 of the photoresist layer PR overlapping the second mask area PMA2.

The photo opening PROP may penetrate through the photoresist pattern layer PRT from an upper surface PRU of the photoresist pattern layer PRT to a lower surface PRB of the photoresist pattern layer PRT. The groove PRH may have a depth PRH-D smaller than a maximum thickness PRT-T of the photoresist pattern layer PRT. In an embodiment, the depth PRH-D of the groove PRH may be at a level of about 50 percent of the maximum thickness PRT-T of the photoresist pattern layer PRT, for example, however, it should not be particularly limited.

The second mask layer MK2L may include a first area MKA1 and a second area MKA2, which are defined therein. The first area MKA1 may be defined as a portion of the second mask layer MK2L exposed through the photo opening PROP. That is, the first area MKA1 of the second mask layer MK2L may be exposed by removing the first portion PRP1 of the photoresist layer PR (refer to FIG. 4C).

The second area MKA2 may surround the first area MKA1. The second area MKA2 may overlap the photoresist pattern layer PRT. The portion of the second area MKA2 may overlap the groove PRH.

Figure 4E:
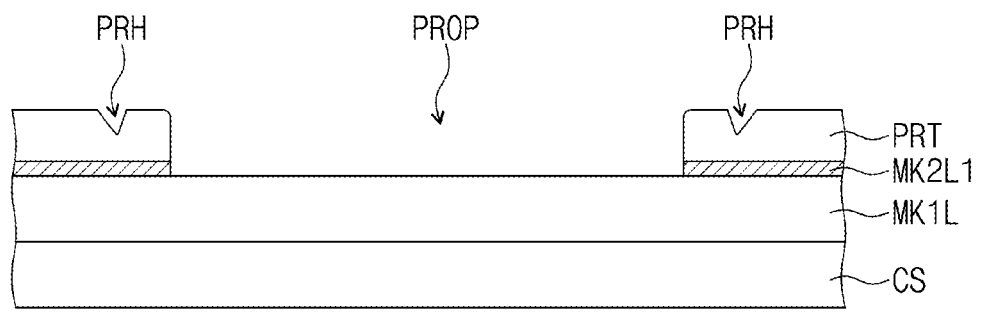

Referring to FIGS. 3, 4D, and 4E, the second mask layer MK2L may be removed in the first area MKA1 (S400). The second mask layer MK2L in the first area MKA1 may be removed by an etching process. In an embodiment, the second mask layer MK2L in the first area MKA1 may be removed by a wet etching process, for example, however, it should not be particularly limited.

Figure 4F:
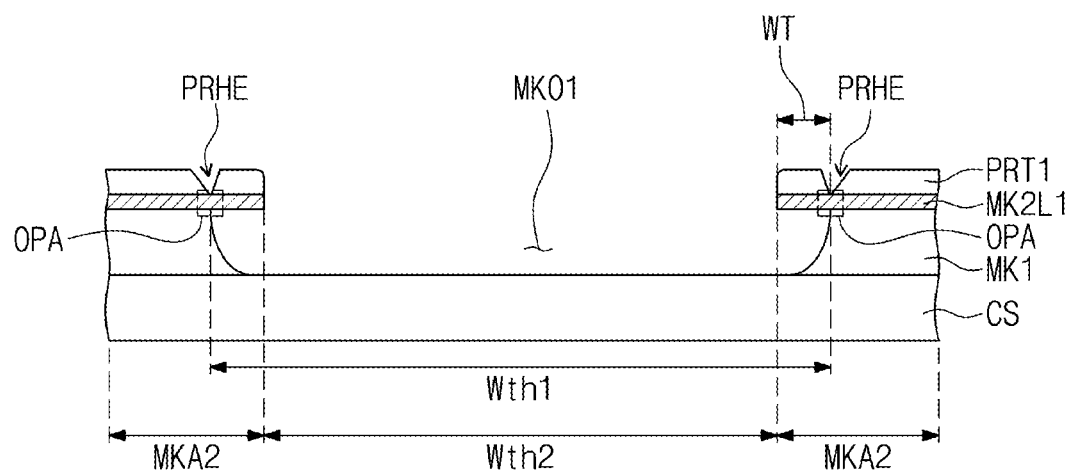

Referring to FIGS. 3, 4E, and 4F, a portion of the first mask layer MK1L may be exposed by a second mask layer MK2L1 from which the first area MKA1 is removed. The etching process may be carried out from the portion of the exposed first mask layer MK1L. The portion of the first mask layer MK1L and the portion of the photoresist pattern layer PRT may be substantially simultaneously etched. In an embodiment, the portion of the first mask layer MK1L and the portion of the photoresist pattern layer PRT may be removed by a dry etching process, for example, however, it should not be particularly limited.

The portion of the first mask layer MK1L may be etched to form the first opening MKO1 (S500). Substantially simultaneously, a portion in the thickness direction DR3 of the photoresist pattern layer PRT may be etched to form a photoresist pattern layer PRT1 with a reduced thickness. Due to an etched groove PRHE, a portion OPA of the second mask layer MK2L1 in the second area MKA2 may be exposed (S600).

In a plan view, a maximum area size of the first opening MKO1 may be greater than an area size of the first area MKA1 of the second mask layer MK2L1. In an embodiment, in a cross section, a maximum width Wth1 of the first opening MKO1 corresponding to the maximum area size of the first opening MKO1 may be greater than a width Wth2 of the first area MKA1 of the second mask layer MK2L1 corresponding to the area size of the first area MKA1 of the second mask layer MK2L1, for example. Accordingly, the portion of the second area MKA2 may overlap the first opening MKO1. That is, the second area MKA2 may protrude further than a sidewall that defines the first opening MKO1.

In a case where the second area MKA2 overlapping the first opening MKO1 remains, the second area MKA2 may be separated during the manufacturing process of a display panel and a foreign substance may occur, thereby causing a deterioration in the deposition precision. In an embodiment, the portion OPA of the second area MKA2 exposed due to the groove PRI-1E may be etched, and thus, the protruded second area MKA2 overlapping the first opening MKO1 may be removed. Accordingly, when the deposition process is carried out using the mask MK (refer to FIG. 2), the deposition precision and the deposition reliability may be improved.

Figure 4G:
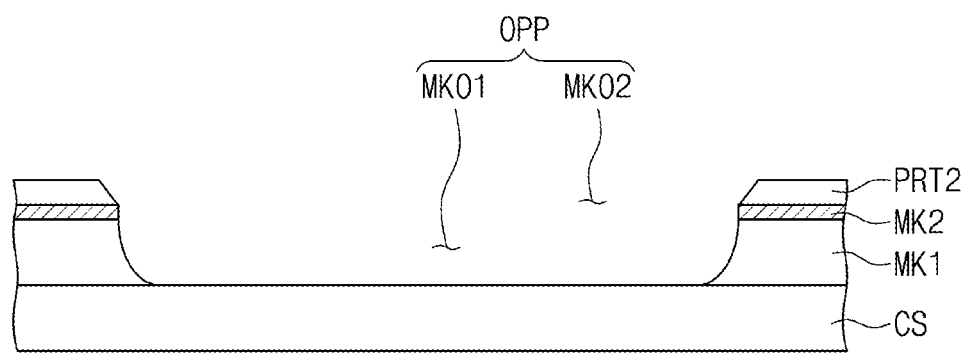

Referring to FIGS. 3, 4F, and 4G, the portion OPA of the second area MKA2 may be removed by the etching process to form the second opening MKO2 (S700). In an embodiment, the portion OPA of the second area MKA2 may be etched by a wet etching process, for example, however, it should not be particularly limited. Then, a remaining photoresist pattern layer PRT2 may be removed.

In an embodiment, the first opening MKO1 of the first mask layer MK1 may be defined and the protruded tip portion of the second mask layer MK2L1 may be removed using the photoresist pattern layer PRT (refer to FIG. 4E) provided through one photolithography process. Accordingly, a quality of the mask MK (refer to FIG. 2) may be improved, and a manufacturing cost of the mask MK (refer to FIG. 2) may be reduced.

Figure 5:
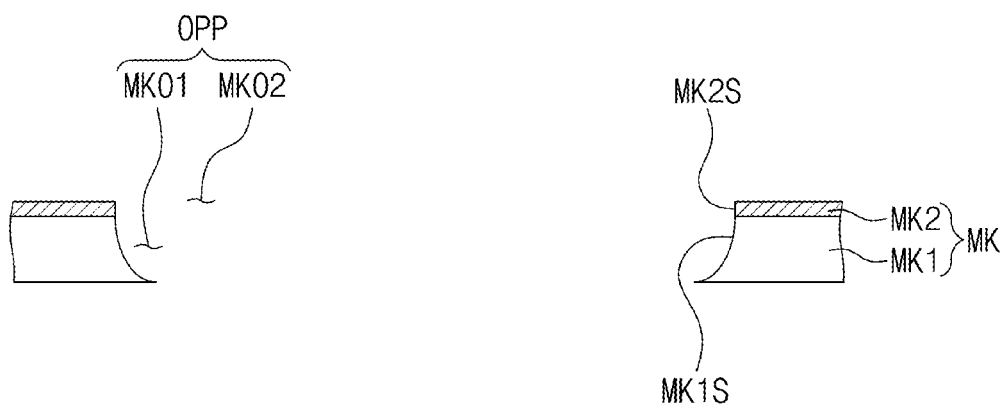
FIG. 5 is a cross-sectional view showing an embodiment of a mask according to the invention.

FIG. 5 is a cross-sectional view showing the mask according to the invention.

Referring to FIG. 5, the mask MK may include the first mask layer MK1 and the second mask layer MK2, the first opening MKO1 may be defined through the first mask layer MK1, and the second opening MKO2 may be defined through the second mask layer MK2. The second mask layer MK2 may be in contact with one surface of the first mask layer MK1.

In an embodiment, the protruded tip portion of the second mask layer MK2L1 (refer to FIG. 4F) may be removed using the photoresist pattern layer (also referred to as a photoresist pattern) PRT1 (refer to FIG. 4F) used when the first opening MKO1 is defined without using an additional photoresist process. As a result, a manufacturing yield of the mask MK may be improved.

In addition, since the first opening MKO1 and the second opening MKO2 are defined using the photoresist pattern layer PRT1 (refer to FIG. 4F), a center of the first opening MKO1 in a plan view and a center of the second opening MKO2 in a plan view may overlap each other.

A first sidewall MK1S of the first mask layer MK1 defining the first opening MKO1 and a second sidewall MK2S of the second mask layer MK2 defining the second opening MKO2 may be aligned with each other. In an embodiment, the first sidewall MK1S and the second sidewall MK2S may consecutively extend to each other to define one sidewall, for example.

Figure 6:
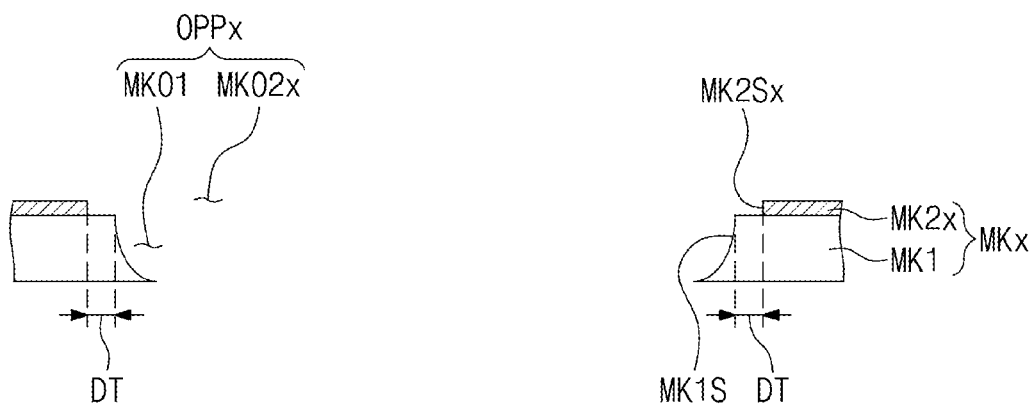
FIG. 6 is a cross-sectional view showing an embodiment of a mask according to the invention.

FIG. 6 is a cross-sectional view showing a mask MKx according to the invention.

Referring to FIG. 6, the mask MKx may include a first mask layer MK1 and a second mask layer MK2x, a first opening MKO1 may be defined through the first mask layer MK1, and a second opening MKO2x may be defined through the second mask layer MK2x. In a plan view, an area size of the second opening MKO2x may be greater than an area size of the first opening MKO1.

A first sidewall MK1S of the first mask layer MK1 defining the first opening MKO1 and a second sidewall MK2Sx of the second mask layer MK2x defining the second opening MKO2x may be aligned to spaced apart from each other in a plan view. That is, a portion of the first mask layer MK1 may not be covered by the second mask layer MK2x.

In an embodiment, the protruded tip portion of the second mask layer MK2L1 (refer to FIG. 4F) may be removed using the photoresist pattern layer PRT1 (refer to FIG. 4F) used when the first opening MKO1 is defined without using an additional photoresist process. Accordingly, a dispersion in distances DT between the first sidewall MK1S of the first mask layer MK1 and the second sidewall MK2Sx of the second mask layer MK2x may be reduced. In an embodiment, the distances DT between the first sidewall MK1S of the first mask layer MK1 and the second sidewall MK2Sx of the second mask layer MK2x may be substantially the same as each other, for example.

Figure 7:
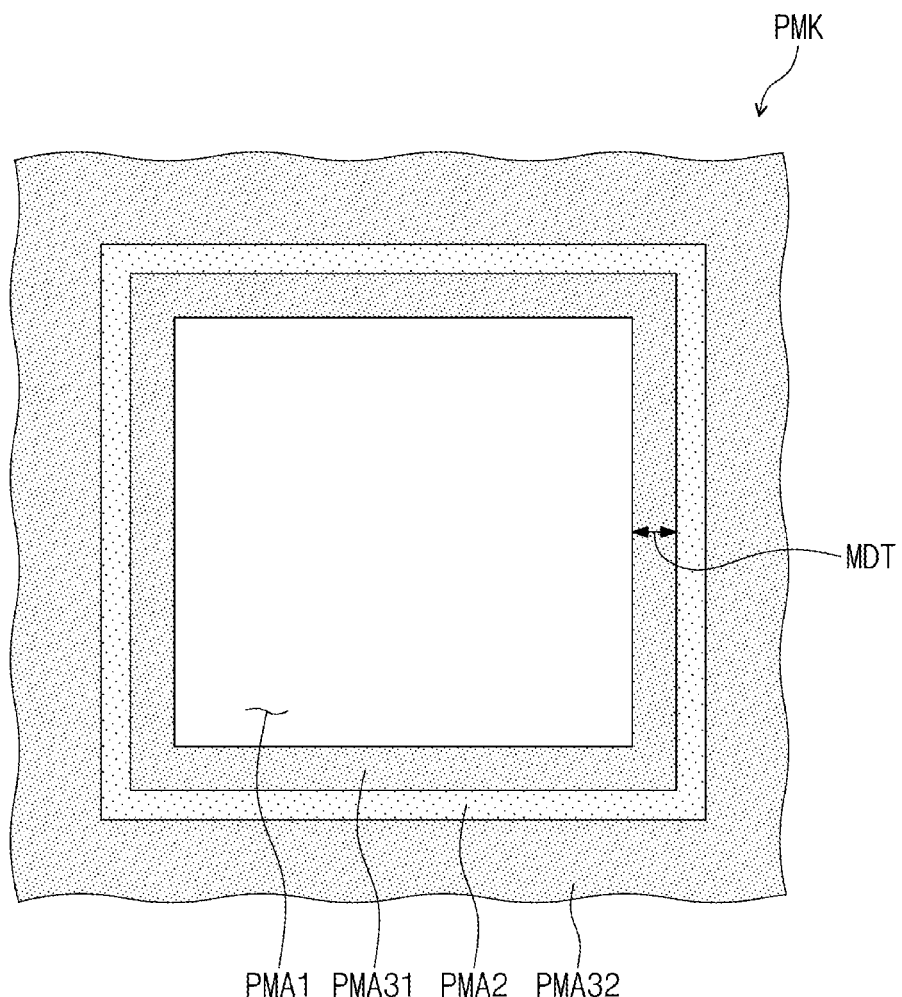
FIG. 7 is a plan view showing an embodiment of an exposure mask according to the invention.

FIG. 7 is a plan view showing the exposure mask PMK according to the invention.

Referring to FIG. 7, the exposure mask PMK may be provided with the opening defined therethrough, and an area in which the opening is defined may correspond to the first mask area PMA1. The third mask area PMA31 may surround the first mask area PMA1, the second mask area PMA2 may surround the third mask area PMA31, and the third mask area PMA32 may surround the second mask area PMA2. The second mask area PMA2 may be spaced apart from the first mask area PMA1 with the third mask area PMA31 interposed therebetween.

The first mask area PMA1 may have a quadrangular shape in a plan view, however, the shape of the first mask area PMA1 should not be limited to the quadrangular shape. The first mask area PMA1 may have a shape corresponding to a deposition target area. Accordingly, the first mask area PMA1 may have a variety of shapes, such as a circular shape, an oval shape, a lozenge shape, a polygonal shape, an atypical shape, in addition to the quadrangular shape.

A distance MDT between the first mask area PMA1 and the second mask area PMA2 may be determined based on a width WT (refer to FIG. 4F) of the second mask layer MK2L1 (refer to FIG. 4F) overlapping the opening MKO1 (refer to FIG. 4F).

The exposure mask PMK may include a light blocking layer to block the light. The transmittance of the second mask area PMA2 may be controlled by removing a portion in the thickness direction DR3 of the light blocking layer. The light blocking layer may include chromium, however, it should not be particularly limited.

Figure 8:
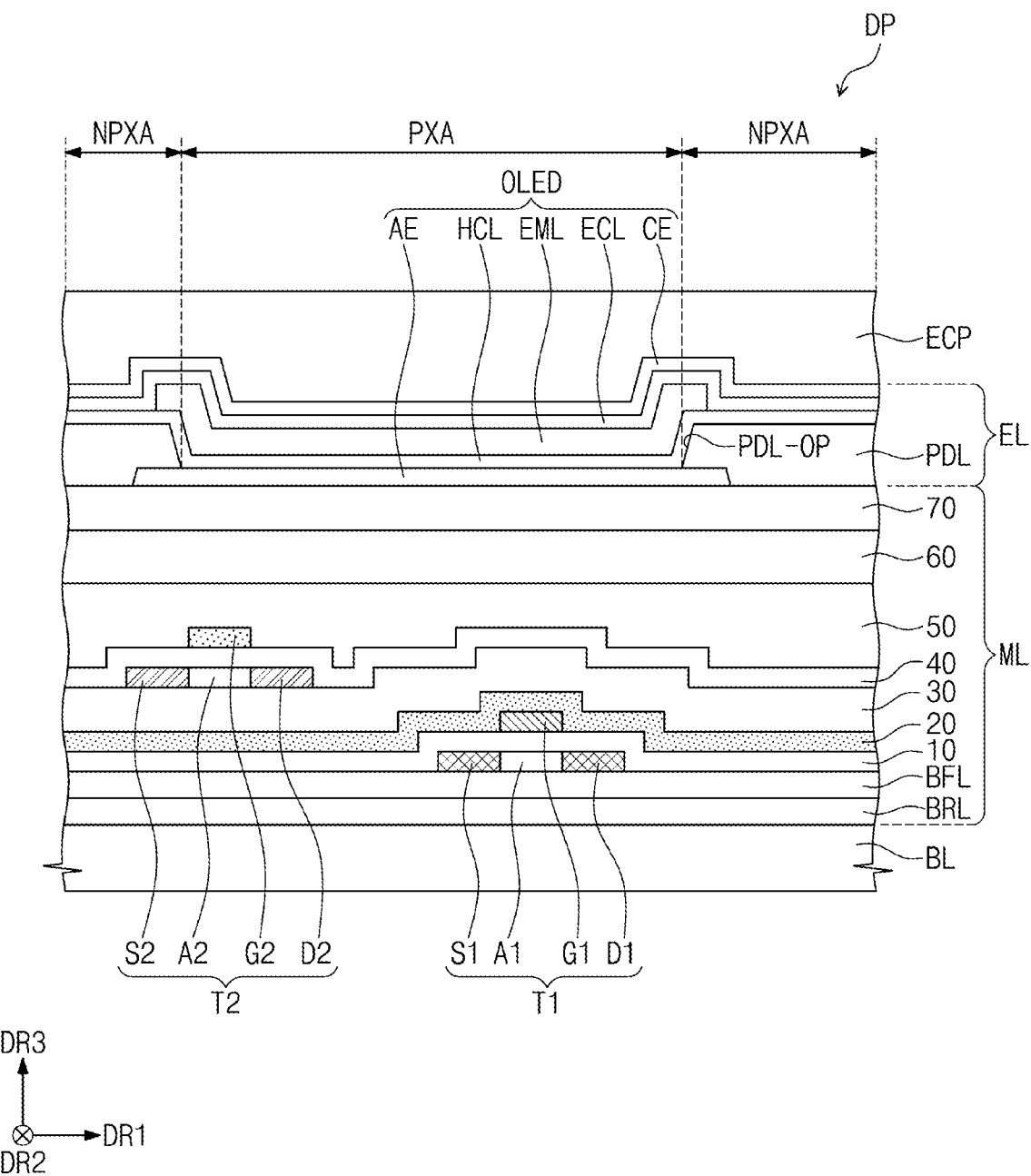
FIG. 8 is a cross-sectional view showing an embodiment of a display panel according to the invention.

FIG. 8 is a cross-sectional view showing an embodiment of the display panel DP according to the invention.

Referring to FIG. 8, the display panel DP may be a light emitting display panel. FIG. 8 shows a cross-section corresponding to one pixel among pixels, i.e., a cross-section corresponding to two transistors T1 and T2 and a light emitting element OLED.

Referring to FIG. 8, the display panel DP may include a base layer BL, a circuit element layer ML disposed on the base layer BL, a display element layer EL disposed on the circuit element layer ML, and an encapsulation layer ECP disposed on the display element layer EL.

The base layer BL may include a glass substrate or a synthetic resin layer. The base layer BL may be provided by forming the synthetic resin layer on a support substrate used when the display panel DP is manufactured, forming a conductive layer and an insulating layer on the synthetic resin layer, and removing the support substrate.

The circuit element layer ML may include at least one insulating layer and a circuit element. The circuit element may include a signal line and a driving circuit of the pixel. The circuit element layer ML may be provided by forming an insulating layer, a semiconductor layer, and a conductive layer through a coating or deposition process and by patterning the insulating layer, the semiconductor layer, and the conductive layer through several photolithography processes.

In the illustrated embodiment, the circuit element layer ML may include a buffer layer BFL, a barrier layer BRL, and first to seventh insulating layers 10 to 70. The buffer layer BFL, the barrier layer BRL, and the first to seventh insulating layers 10 to 70 may include one of an inorganic layer and an organic layer. The buffer layer BFL and the barrier layer BRL may include the inorganic layer. At least one of the fifth to seventh insulating layers 50 to 70 may include the organic layer.

FIG. 8 shows an arrangement relation between a first active A1, a second active A2, a first gate G1, a second gate G2, a first source S1, a second source S2, a first drain D1, and a second drain D2 that form the first and second transistors T1 and T2. In the illustrated embodiment, the first active A1 and the second active A2 may include different materials from each other. In an embodiment, the first active A1 may include a polysilicon semiconductor, and the second active A2 may include a metal oxide semiconductor, for example. The first source S1 and the first drain D1 may have a doping concentration higher than that of the first active A1 and may have a function of an electrode. The second source S2 and the second drain D2 may be areas where the metal oxide semiconductor is reduced and may have a function of an electrode.

In an embodiment, the first active A1 and the second active A2 may include the same semiconductor material as each other. In this case, the second transistor T2 may have the same stack structure as that of the first transistor T1, and thus, the stack structure of the circuit element layer ML may be simplified.

The display element layer EL may include a pixel definition layer PDL and the light emitting element OLED. The light emitting element OLED may be an organic light emitting diode or a quantum dot light emitting diode. An anode AE may be disposed on the seventh insulating layer 70. At least a portion of the anode AE may be exposed through an opening PDL-OP defined through the pixel definition layer PDL. The opening PDL-OP of the pixel definition layer PDL may define a light emitting area PXA. A non-light-emitting area NPXA may surround the light emitting area PXA.

A hole control layer HCL and an electron control layer ECL may be commonly disposed over the light emitting area PXA and the non-light-emitting area NPXA. A light emitting pattern EML may be provided in a pattern shape to correspond to the opening PDL-OP. The light emitting pattern EML may be deposited in different ways compared with the hole control layer HCL and the electron control layer ECL, each of which has a layer shape. The hole control layer HCL and the electron control layer ECL may be commonly provided in the pixels using an open mask. The light emitting pattern EML may be provided in a pattern shape corresponding to the opening PDL-OP using the mask. However, it should not be limited thereto or thereby, and the hole control layer HCL and the electron control layer ECL may be also provided in a pattern shape corresponding to the opening PDL-OP using the mask in the embodiment of the invention as the light emitting pattern EML.

A cathode CE may be disposed on the electron control layer ECL. The encapsulation layer ECP may be disposed on the cathode CE. The encapsulation layer ECP may be a thin film encapsulation ("TFE") layer to encapsulate the display element layer EL. The encapsulation layer ECP may include a plurality of thin films. The thin films may include an inorganic layer and an organic layer. The encapsulation layer ECP may include an insulating layer to encapsulate the display element layer EL and a plurality of insulating layers to improve a light emitting efficiency.

Figure 9:
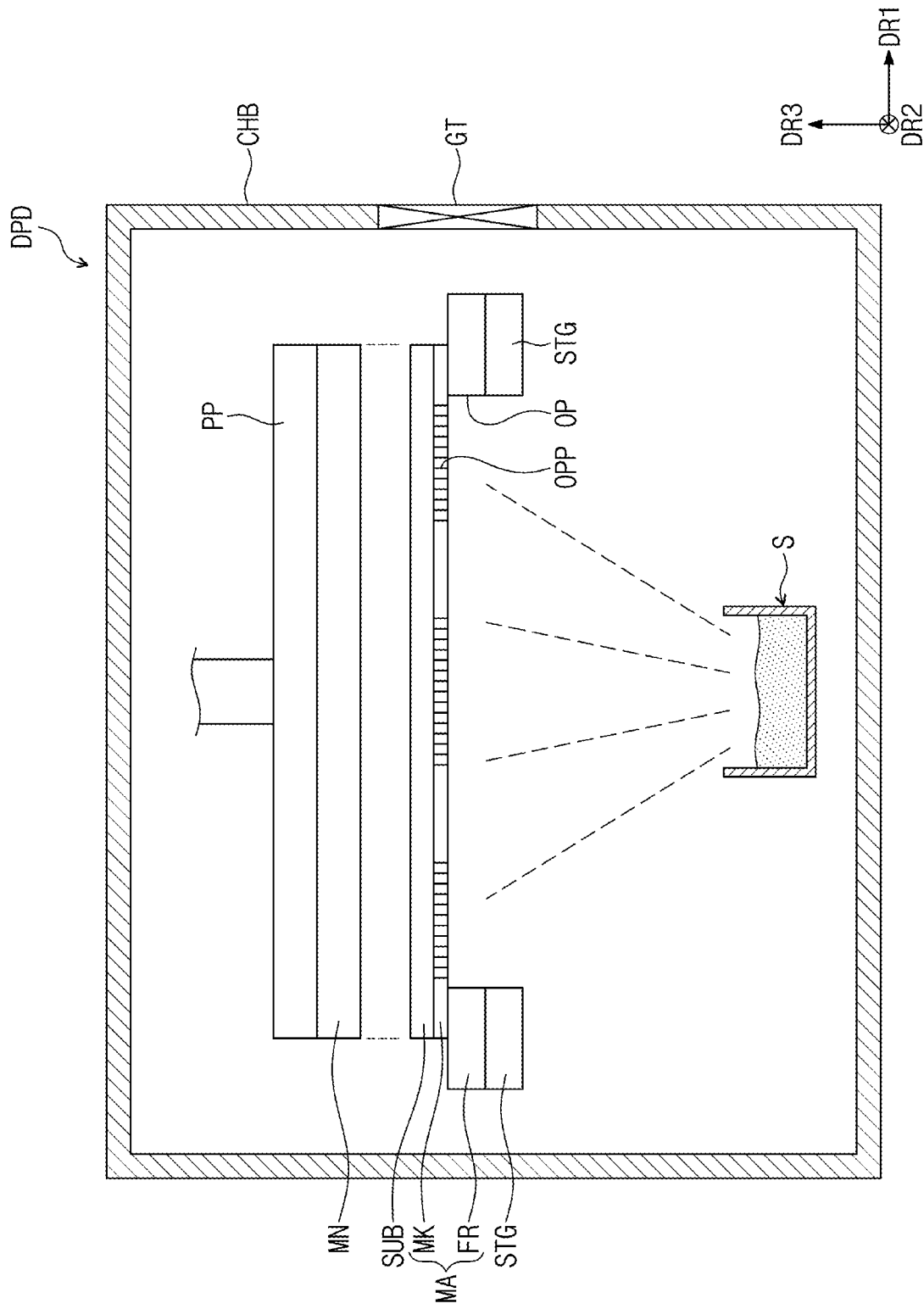
FIG. 9 is a cross-sectional view showing an embodiment of a deposition apparatus according to the invention.

FIG. 9 is a cross-sectional view showing an embodiment of a deposition apparatus according to the invention.

Referring to FIG. 9, the deposition apparatus DPD may include a chamber CHB, a deposition source S, a stage STG, a moving plate PP, and the mask assembly MA.

The chamber CHB may provide a sealed space. The deposition source S, the stage STG, the moving plate PP, and the mask assembly MA may be disposed in the chamber CHB. The chamber CHB may include at least one gate GT. Due to the gate GT, the chamber CHB may be opened and closed. The target substrate SUB may enter into or may be taken out from the chamber CHB via the gate GT defined through the chamber CHB.

The deposition source S may include a deposition material. In this case, the deposition material may be a sublimable or vaporable material and may include at least one of an inorganic material, a metal material, and an organic material. Hereinafter, the deposition source S according to the invention that includes an organic material used to manufacture the organic light emitting element OLED (refer to FIG. 8) will be described as a representative example.

The stage STG may be disposed on the deposition source S. The mask assembly MA may be disposed on the stage STG. The mask assembly MA may face the deposition source S. The stage STG may overlap the frame FR of the mask assembly MA to support the mask assembly MA. The stage STG may not overlap the opening OP of the frame FR. That is, the stage STG may be disposed outside a path through which the deposition material is supplied to the target substrate SUB from the deposition source S.

The target substrate SUB may be disposed on the mask assembly MA. The deposition material may be deposited on the target substrate SUB after passing through the through-holes OPP.

The moving plate PP may align the target substrate SUB on the mask assembly MA. The moving plate PP may move vertically or horizontally. In an embodiment, a magnetic substance MN may be disposed on the moving plate PP, and the target substrate SUB may move by a magnetic force. In addition, the magnetic substance MN may generate the magnetic force to allow the mask MK to be in contact with a lower portion of the target substrate SUB, and thus, the precision in the deposition process may be improved.

Figure 10:
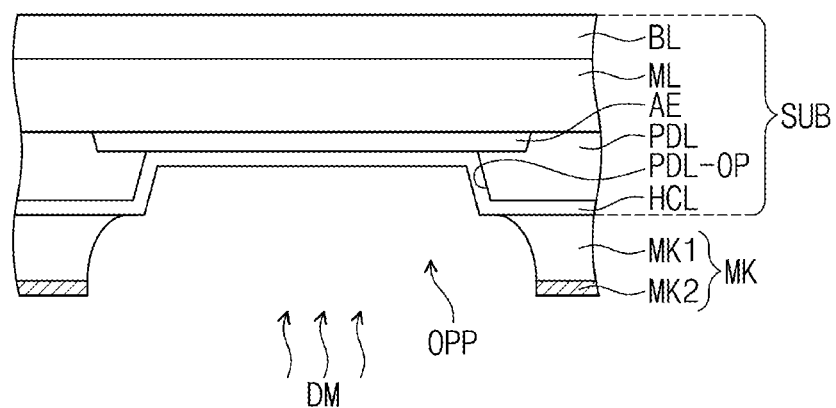
FIG. 10 is an enlarged cross-sectional view showing an embodiment of a portion of a target substrate and a portion of a mask according to the invention.

FIG. 10 is an enlarged cross-sectional view showing a portion of the target substrate SUB and a portion of the mask MK according to the invention.

Referring to FIGS. 8, 9, and 10, the light emitting pattern EML may be provided in the pattern shape to correspond to the opening PDL-OP using the mask MK in the manufacturing method of the display panel. In more detail, the light emitting pattern EML may allow the deposition material DM deposited upward from the deposition source S to be patterned to correspond to the opening PDL-OP through the mask MK in the deposition apparatus DPD. In the process of patterning the light emitting pattern EML, the mask MK may be disposed to be in contact with the target substrate SUB by the magnetic substance MN included in the deposition apparatus DPD.

Figure 11A:
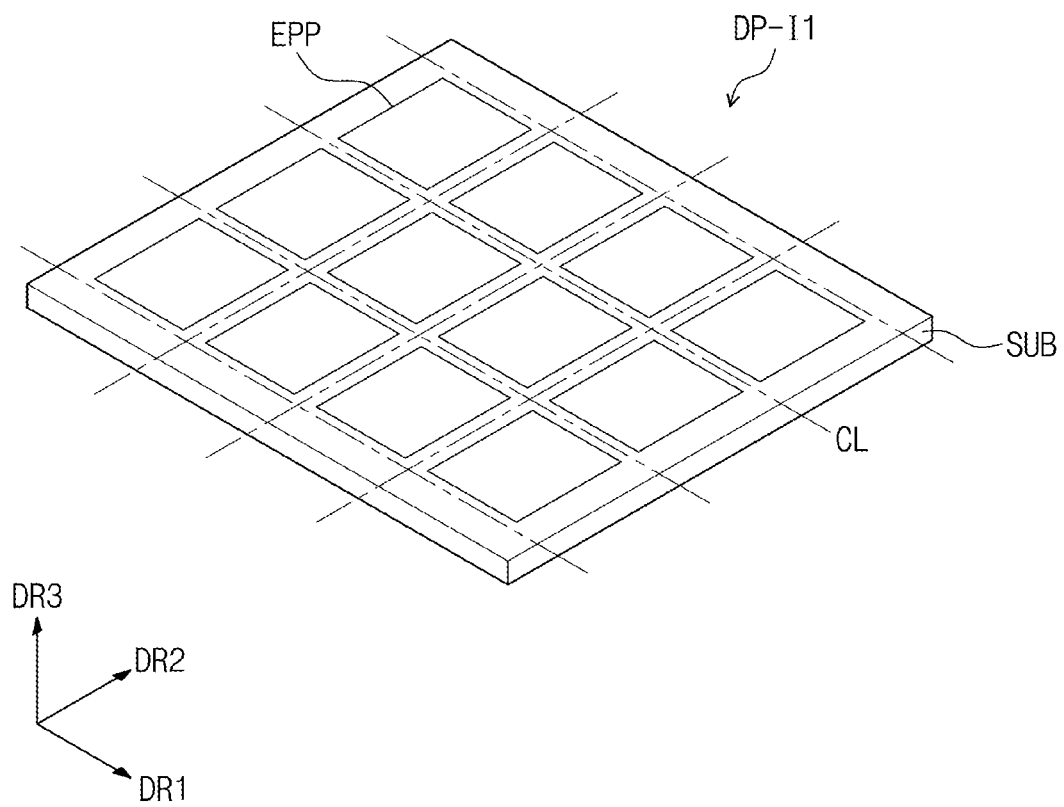
FIGS. 11A and 11B are views showing an embodiment of a method of manufacturing a display panel according to the invention.
Figure 11B:
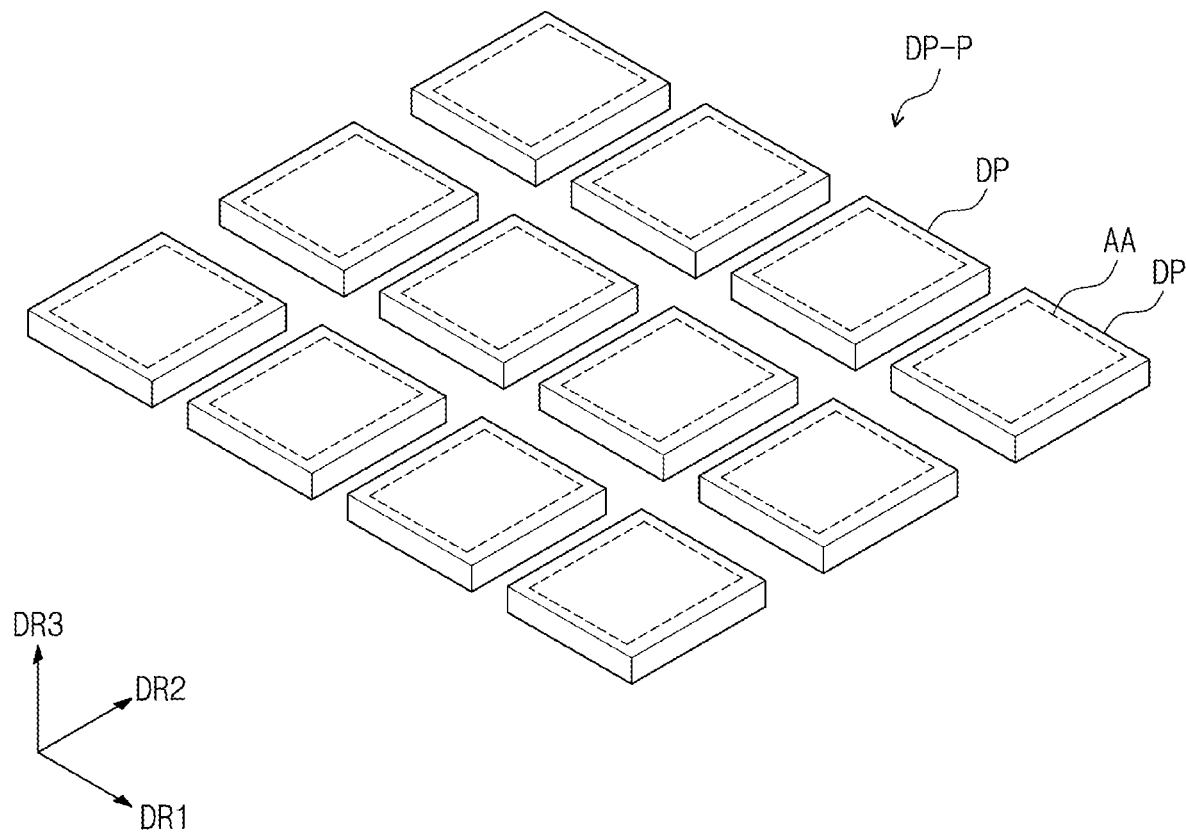

FIGS. 11A and 11B are views showing an embodiment of the manufacturing method of the display panel according to the invention.

Referring to FIGS. 1, 9, 11A, and 11B, the mask assembly MA may be removed after the deposition material DM (refer to FIG. 10) is deposited on the target substrate SUB by the deposition apparatus DPD. A substrate DP-I1 from which the mask assembly MA is removed may be in a state in which light emitting pattern layers EPP are disposed on the target substrate SUB. The light emitting pattern layers EPP may respectively correspond to the cell areas CA of the mask MK. Each of the light emitting pattern layers EPP may include the light emitting patterns EML (refer to FIG. 8).

Then, the substrate DP-I1 may be cut along cutting lines CL and may be divided into a plurality of panels DP-P. Each of the panels DP-P may form the display panel DP. The display panel DP may include at least one active area AA. The active area AA may include a plurality of pixels. The active area AA may correspond to an area in which the light emitting pattern layer EPP is disposed.

In an embodiment, as one initial substrate DP-I1 is patterned, the plural display panels DP may be provided. In addition, since the mask used to form the display panel includes the layer including the polymer material such as PI, a large-area mask process appropriate to form the plural display panels DP may be performed. Thus, the process time may be shortened, and the process cost may be reduced. However, in an embodiment, one display panel DP may be provided from the initial substrate DP-I1 depending on the size of the display panel DP.

Although the embodiments of the invention have been described, it is understood that the invention should not be limited to these embodiments but various changes and modifications may be made by one ordinary skilled in the art within the spirit and scope of the invention as hereinafter claimed. Therefore, the disclosed subject matter should not be limited to any single embodiment described herein.

What is claimed is:

1. A method of manufacturing a mask, the method comprising:
    forming a first mask layer;
    forming a second mask layer on the first mask layer;
    forming a photoresist pattern layer on the second mask layer;
    removing a first area of the second mask layer, which is exposed through the photoresist pattern layer;
    defining an opening through the first mask layer;
    removing a portion of the photoresist pattern layer and exposing a portion of a second area of the second mask layer; and
    removing the portion of the second area of the second mask layer
    wherein a maximum area size of the opening is greater than an area size of the first area of the second mask layer in a plan view.

2. The method of claim 1, wherein the second area of the second mask layer overlaps a sidewall of the first mask layer, which defines the opening.

3. The method of claim 1, wherein the portion of the photoresist pattern layer is removed when the opening is defined through the first mask layer.

4. The method of claim 1, wherein the first mask layer has a thickness greater than a thickness of the second mask layer.

5. The method of claim 1, wherein the first mask layer comprises a polymer material, and the second mask layer comprises a conductive material.

6. The method of claim 1, wherein the second area of the second mask layer surrounds the first area of the second mask layer.

7. The method of claim 1, wherein the forming the photoresist pattern layer comprises:
    forming a photoresist layer on the second mask layer;
    disposing an exposure mask comprising a first mask area having a first transmittance, a second mask area having a second transmittance smaller than the first transmittance, and a third mask area having a third transmittance smaller than the second transmittance, which are defined therein, on the photoresist layer; and
    patterning the photoresist layer using the exposure mask.

8. The method of claim 7, wherein a photo opening and a groove surrounding the photo opening are defined in the photoresist pattern layer, and the photo opening overlaps the first area of the second mask layer.

9. The method of claim 8, wherein the photo opening is defined in a first portion of the photoresist layer overlapping the first mask area, and the groove is defined in a second portion of the photoresist layer overlapping the second mask area.

10. The method of claim 8, wherein the photo opening is defined through the photoresist pattern layer from a first surface of the photoresist pattern layer to a second surface of the photoresist pattern layer opposite to the first surface of the photoresist pattern layer, and the groove has a depth that is smaller than a maximum thickness of the photoresist pattern layer.

11. The method of claim 8, wherein the second area of the second mask layer overlaps the groove.

12. A method of manufacturing a mask, the method comprising:
    forming a first mask layer;
    forming a second mask layer on the first mask layer;
    forming a photoresist pattern layer on the second mask layer;
    removing a first area of the second mask layer, which is exposed through the photoresist pattern layer;
    defining an opening through the first mask layer;
    removing a portion of the photoresist pattern layer and exposing a portion of a second area of the second mask layer; and
    removing the portion of the second area of the second mask layer,
    wherein the forming the photoresist pattern layer comprises:
        forming a photoresist layer on the second mask layer;
        disposing an exposure mask comprising a first mask area having a first transmittance, a second mask area having a second transmittance smaller than the first transmittance, and a third mask area having a third transmittance smaller than the second transmittance, which are defined therein, on the photoresist layer; and
    patterning the photoresist layer using the exposure mask, and wherein the second mask area is spaced apart from the first mask area with the third mask area interposed therebetween.

13. A method of manufacturing a display panel, comprising:
    forming a mask through which a through-hole is defined, the forming the mask comprising:
        forming a first mask layer;
        forming a second mask layer on the first mask layer;
        forming a photoresist pattern layer in which a photo opening and a groove surrounding the photo opening are defined on the second mask layer;
        removing a first area of the second mask layer, which overlaps the photo opening;
        etching a portion of the first mask layer and a portion of the photoresist pattern layer; and
        etching a second area of the second mask layer exposed through the etched groove;
    preparing a target substrate;
    disposing the mask on the target substrate;
    forming a light emitting pattern in a light emitting area of the target substrate corresponding to the through-hole; and
    removing the mask.

14. The method of claim 13, wherein the portion of the first mask layer is removed and an opening is defined through the first mask layer from a first surface of the first mask layer to a second surface of the first mask layer opposite to the first surface of the first mask layer.

15. The method of claim 14, wherein the etching the second area of the second mask layer comprises removing a portion of the second mask layer, which overlaps the opening.

16. The method of claim 14, wherein the forming the photoresist pattern layer comprises:
    forming a photoresist layer on the second mask layer;

disposing an exposure mask comprising a first mask area having a first transmittance, a second mask area having a second transmittance smaller than the first transmittance, and a third mask area having a third transmittance smaller than the second transmittance, on the photoresist layer; and patterning the photoresist layer using the exposure mask, the photo opening is defined in a portion of the photoresist layer, which overlaps the first mask area of the exposure mask, and the groove is defined in another portion of the photoresist layer, which overlaps the second mask area of the exposure mask.

* * * * *